(12) United States Patent
Ghassemi et al.

(10) Patent No.: US 10,986,730 B2
(45) Date of Patent: Apr. 20, 2021

(54) TECHNIQUES FOR ROUTING ELECTRICAL SIGNALS THROUGH ELECTRICAL COMPONENTS AND RELATED METHODS

(71) Applicant: Microsemi Semiconductor ULC, Ottawa (CA)

(72) Inventors: Nasser Ghassemi, Kanata (CA); Mehran Aliahmad, Manotick (CA)

(73) Assignee: Microsemi Semiconductor ULC, Ottawa (CA)

( * ) Notice: Subject to any disclaimer, the term of this patent is extended or adjusted under 35 U.S.C. 154(b) by 0 days.

(21) Appl. No.: 16/418,792

(22) Filed: May 21, 2019

(65) Prior Publication Data

US 2020/0288573 A1  Sep. 10, 2020

Related U.S. Application Data

(60) Provisional application No. 62/815,901, filed on Mar. 8, 2019.

(51) Int. Cl.
*H05K 1/11* (2006.01)
*H05K 3/40* (2006.01)

(52) U.S. Cl.
CPC ........... *H05K 1/116* (2013.01); *H05K 3/4038* (2013.01)

(58) Field of Classification Search
CPC .............................. H05K 3/4038; H05K 1/116
USPC ......................................................... 174/255
See application file for complete search history.

(56) References Cited

U.S. PATENT DOCUMENTS

2015/0092374 A1\* 4/2015 Isaacs .................. H05K 1/0206
361/767
2019/0297731 A1\* 9/2019 Hitsuoka ................ H05K 1/116

\* cited by examiner

*Primary Examiner* — Tremesha S Willis
(74) *Attorney, Agent, or Firm* — TraskBritt

(57) ABSTRACT

Substrates configured to route electrical signals may include a first dielectric material and an electrically conductive material located on a first side of the first dielectric material. A second dielectric material may be located on a second, opposite side of the first dielectric material. A series of voids may be defined by the second dielectric material extending from the first dielectric material at least partially through the second dielectric material. Footprints of at least some of the voids of the series of voids may at least partially laterally overlap with the electrically conductive material.

24 Claims, 6 Drawing Sheets

TECHNIQUES FOR ROUTING ELECTRICAL SIGNALS THROUGH ELECTRICAL COMPONENTS AND RELATED METHODS

CROSS-REFERENCE TO RELATED APPLICATION

This application claims the benefit of the priority date of U.S. Provisional Patent Application No. 62/815,901, filed Mar. 8, 2019, and titled "Substrates for Routing Electrical Signals and Related Methods," the disclosure of which is incorporated herein in its entirety by this reference.

FIELD

This disclosure relates generally to substrates configured to route electrical signals and methods of making such substrates. More specifically, disclosed embodiments relate to printed circuit boards and configurations for components of printed circuit boards that may improve signal quality and accuracy.

BACKGROUND

Printed circuit boards may generally include a dielectric core having signal-routing transmission lines including electrically conductive material on a major surface of the dielectric core. A dielectric material may be located adjacent to the dielectric core on at least one side of the dielectric core, and may optionally cover the transmission lines. A ground plane may be located on a side of the dielectric material opposite the dielectric core.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular substrate, printed circuit board, or component thereof, but are merely idealized representations employed to describe illustrative embodiments. Thus, the drawings are not necessarily to scale.

Disclosed embodiments relate generally to printed circuit boards and configurations for components of printed circuit boards that may improve signal quality and accuracy. More specifically, disclosed are embodiments of substrates configured to route electrical signals that may include holes or voids in dielectric materials proximate to transmission lines.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

Figure 1:
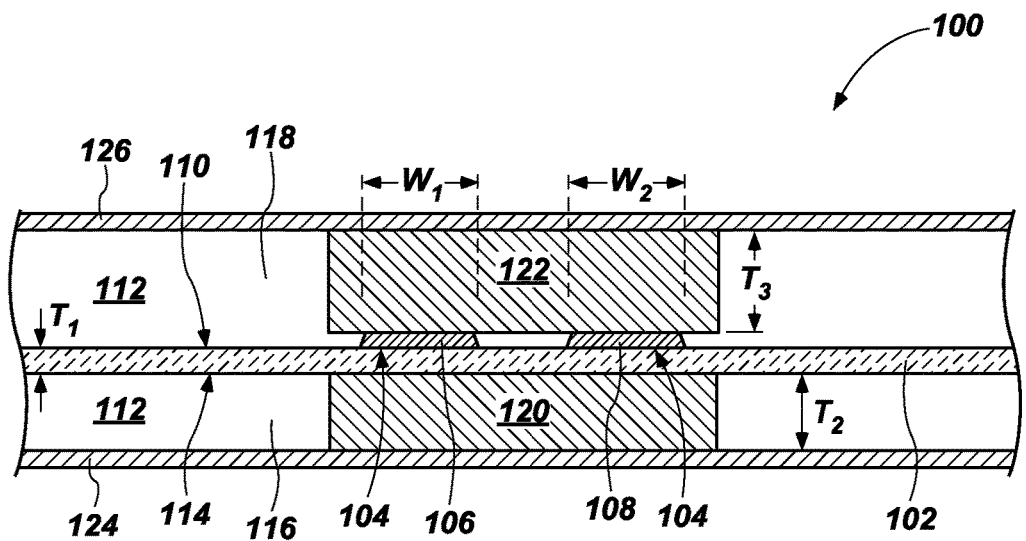
FIG. 1 is a cross-sectional side view of a substrate configured to route electrical signals.

FIG. 1 is a cross-sectional side view of a substrate 100 configured to route electrical signals. More specifically, the substrate 100 may be configured as, for example, a printed circuit board for routing electrical signals and voltages and for forming electrical and mechanical connections with electrical components, or a subcomponent of, portion of, or intermediate product in a method of forming a printed circuit board. The substrate 100 may include a first dielectric material 102, which may be configured as, for example, a wafer, chip, or layer including (or formed completely of) the first dielectric material 102. More specifically, the first dielectric material 102 may be configured as a dielectric core at least substantially composed of a polymer material, such as, for example, polyphenylene ether or polytetrafluoroethylene. As specific, nonlimiting examples, the first dielectric material 102 may include (or be substantially composed of) a MEGTRON® 4, MEGTRON® 6, or MEGTRON® 7 material, available from Panasonic Corporation.

A first thickness $T_1$ of the first dielectric material 102, as measured in a direction at least substantially perpendicular to a first major surface 110 of the first dielectric material 102 having a greatest surface area of any surface of the first dielectric material 102, may be, for example, about 0.005 inch or less. More specifically, the first thickness $T_1$ of the first dielectric material 102 may be, for example, about 0.003 inch or less. As a specific, nonlimiting example, the first thickness $T_1$ of the first dielectric material 102 may be about 0.002 inch or less (e.g., about 0.001 inch).

At least one quantity of electrically conductive material 104 may be located on a first side (e.g., adjacent to a first major surface 110) of the first dielectric material 102. For example, the substrate 100 may include a first quantity 106 of the electrically conductive material 104 and a second, laterally adjacent quantity 108 of the electrically conductive material 104 extending along the first major surface 110 of the first dielectric material 102. More specifically, the substrate 100 may include a first trace 106 of the electrically conductive material 104 and a second, laterally adjacent trace 108 of the electrically conductive material 104 extending in at least substantially the same directions as (e.g., at least substantially parallel to) the first trace 106 along the first major surface 110. As specific, nonlimiting examples, the substrate 100 may include a first trace 106 of the electrically conductive material 104 configured as a transmission line and a second, laterally adjacent trace 108 of the electrically conductive material 104 configured as another transmission line extending in at least substantially the same directions as (e.g., at least substantially parallel to) the first trace 106 along the first major surface 110 between points of connection for other devices and/or power supplies. The electrically conductive material 104 may be located at any depth within the substrate 100. For example, multiple layers or strata of the electrically conductive material 104 may be present through the thickness of the substrate 100, and the relevant first and second quantities 106 and 108 may be located in any of those layers or strata.

The first and second quantities 106 and 108 of the electrically conductive material 104 specifically depicted for the portions of the substrate 100 relevant to this disclosure, and any other quantities of the electrically conductive material 104 in other portions of the substrate 100, may be formed by, for example, removing portions of electrically conductive material 104 located on, and covering a greater area of, the first major surface 110 of the dielectric core than the traces 106 and 108, leaving one or more traces 106 and 108 of the electrically conductive material 104 on the first major surface 110. More specifically, the first and second quantities 106 and 108 of the electrically conductive material 104 may be formed by, for example, masking those portions of electrically conductive material 104 that will form the traces 106 and 108 (and any other traces) and etching a remainder of the electrically conductive material 104 covering the first major surface 110 to reveal the underlying first dielectric material 102 of the dielectric core, leaving one or more traces 106 and 108 of the electrically conductive material 104 on the first major surface 110. The electrically conductive material 104 may include, for example, copper, silver, gold, and alloys and plated layerings thereof.

A second dielectric material 112 may be located on a second, opposite side of the first dielectric material 102 from the first side on which the electrically conductive material 104 is located. For example, a first quantity 116 of the second dielectric material 112 may be located adjacent to a second, opposite major surface 114 of the first dielectric material 102 configured as a dielectric core. More specifically, the first quantity 116 may be configured as one or more layers of the second dielectric material 112 (e.g., formed or provided as a sheet) secured to the second major surface 114 of the first dielectric material 102 of the dielectric core, such that the first dielectric material 102 may be interposed between the quantities 106 and 108 of the electrically conductive material 104 and the first quantity 116 of the second dielectric material 112. As a specific, nonlimiting example, the first quantity 116 of the second dielectric material 112 may be configured as one or more other strata, plies, or layers of additional dielectric cores having other quantities of electrically conductive material thereon for routing other signals and/or voltages, stacked or layered to collectively form the first quantity 116 of the second dielectric material 112.

A second thickness $T_2$ of the first quantity 116 of the second dielectric material 112 (e.g., the combined thicknesses of the individual plies of other dielectric cores including their own traces) may be greater than or equal to the first thickness $T_1$ of the first dielectric material 102. For example, the second thickness $T_2$ of the first quantity 116 of the second dielectric material 112 may be between about 1.25 times and about 5 times greater than the first thickness $T_1$ of the first dielectric material 102. More specifically, the second thickness $T_2$ of the first quantity 116 of the second dielectric material 112 may be, for example, between about 1.5 times and about 4.5 times greater than the first thickness $T_1$ of the first dielectric material 102. As a specific, nonlimiting example, the second thickness $T_2$ of the first quantity 116 of the second dielectric material 112 may be between about 2 times and about 4 times (e.g., about 3 times) greater than the first thickness $T_1$ of the first dielectric material 102. As another example, the second thickness $T_2$ of the first quantity 116 of the second dielectric material 112 may be between about 0.002 inch and about 0.01 inch. More specifically, the second thickness $T_2$ of the first quantity 116 of the second dielectric material 112 may be, for example, between about 0.0025 inch and about 0.0075 inch. As a specific, nonlimiting example, the second thickness $T_2$ of the first quantity 116 of the second dielectric material 112 may be between about 0.003 inch and about 0.005 inch (e.g., about 0.003 inch or 0.004 inch).

In some embodiments, another quantity 118 of the second dielectric material 112 may be located on the first side of the first dielectric material 102 partially over the electrically conductive material 104 remaining on the first major surface 110 of the first dielectric material 102. For example, a second quantity 118 of the second dielectric material 112 may be located adjacent to portions of the first major surface 110 of the first dielectric material 102 configured as a dielectric core and to portions of the traces 106 and 108. More specifically, the second quantity 118 may be configured as one or more layers of the second dielectric material 112 may be secured to portions of the first major surface 110 of the first dielectric material 102 of the dielectric core and to portions of the quantities 106 and 108 of the electrically conductive material 104, such that the quantities 106 and 108 of the electrically conductive material 104 may be interposed between the second quantity 118 of the second dielectric material 112 and the first dielectric material 102 at some locations, and the second quantity 118 may directly abut and be secured to the first major surface 110 of the first dielectric material 102 at other locations. As a specific, nonlimiting example, the second quantity 118 of the second dielectric material 112 may be configured as one or more additional strata, plies, or layers of additional dielectric cores having other quantities of electrically conductive material thereon for routing other signals and/or voltages, stacked or layered to collectively form the second quantity 118 of the second dielectric material 112.

A third thickness $T_3$ of the second quantity 118 of the second dielectric material 112 (e.g., the combined thicknesses of the individual plies of other dielectric cores including their own traces) may be different from the second thickness $T_2$ of the first quantity 116 of the second dielectric material 112 in some embodiments. For example, the third thickness $T_3$ of the second quantity 116 of the second dielectric material 112 may be between about one fourth of and about 2 times greater than the second thickness $T_2$ of the first quantity 116 of the second dielectric material 112. More specifically, the third thickness $T_3$ of the first quantity 116 of the second dielectric material 112 may be, for example, between about one-half of and about 1.5 times greater than the second thickness $T_2$ of the first quantity 116 of the second dielectric material 112. As a specific, nonlimiting example, the third thickness $T_3$ of the first quantity 116 of the second dielectric material 112 may be between about three-quarters of and about 1.25 times greater than (e.g., about two-thirds of or about 1.33 times greater than) the second thickness $T_2$ of the first quantity 116 of the second dielectric material 112. In other embodiments, the third thickness $T_3$ of the second quantity 118 of the second dielectric material 112 may be at least substantially equal to the second thickness $T_2$ of the first quantity 116 of the second dielectric material 112. As another example, the third thickness $T_3$ of the second quantity 118 of the second dielectric material 112 may be between about 0.002 inch and about 0.01 inch. More specifically, the third thickness $T_3$ of the second quantity 118 of the second dielectric material 112 may be, for example, between about 0.003 inch and about 0.008 inch. As a specific, nonlimiting example, the third thickness $T_3$ of the second quantity 118 of the second dielectric material 112 may be between about 0.003 inch and about 0.006 inch (e.g., about 0.004 inch or 0.005 inch).

The second dielectric material 112, including the first quantity 116 and the second quantity 118 in embodiments having the second quantity 118, may include, for example, a polymer material. More specifically, the second dielectric material 112 may include, for example, a fiber-matrix composite material, which may then have one or more other quantities of electrically conductive material supported thereon or therein (e.g., between individual strata, plies, or layers of the second dielectric material 112). As a specific, nonlimiting example, the second dielectric material 112 may be or include a fiber weave embedded within a resin matrix material (e.g., MEGTRON® 4, MEGTRON® 6, MEGTRON® 7) having one or more traces of electrically conductive material on each stratum, ply, or layer of the fiber weave(s) and resin matrix material.

When using fibers (e.g., a fiber weave) as part of the second dielectric material 112, variations in manufacturing, such as, for example, the orientation and proximity of fibers within the matrix material relative to the traces 106 and 108 of electrically conductive material 104, may alter the rate at which signals propagate through the transmission lines of the traces 106 and 108. More specifically, differences in the dielectric properties of the fiber material and the matrix material of the second dielectric material 112, combined with the variations in manufacturing, may cause the dielectric constant of the portion of the second dielectric material 112 immediately adjacent to the first trace 106 to be different from the dielectric constant of the portion of the second dielectric material 112 immediately adjacent to the second trace 108. The different dielectric properties of the second dielectric material 112 immediately adjacent to the respective traces 106 and 108, and along the lengths of the traces 106 and 108, may cause the signals transmitted through the traces 106 and 108 to propagate at different rates. As a result, signals sent at the same time may arrive at their destination at different times in a manner that may fall outside a desired threshold (e.g., a product specification or required characteristic to meet a standard), or which, more generally, may produce an unintended and undesirable response from the device receiving the signals, a phenomenon sometimes referred to as the "fiber weave effect."

In addition, the same variations in manufacturing may reduce the ability of the traces 106 and 108 to consistently transmit signals having different frequencies. For example, the quality of signals at certain frequencies may deteriorate because the frequency response of the traces 106 and 108 may be inconsistent across the frequency spectrum of signals to be transmitted via the traces 106 and 108. Signal deterioration may be particularly severe for high-frequency, high-speed signals, wherein the intensity of the signals at such frequencies may drop below acceptable levels for consistent operation of receiving devices.

To mitigate these and other deficiencies, as well as provide other benefits, a series of voids 120 defined by the second dielectric material 112 may be formed in at least a portion of the first quantity 116 of the second dielectric material 112 adjacent to the relevant quantities 106 and 108 of the electrically conductive material 104. The voids 120 may extend in a direction perpendicular to the first major surface 110 from the first dielectric material 102 at least partially through (e.g., partially or entirely through) at least the first quantity 116 of the second dielectric material 112. By providing voids 120 in the second dielectric material 112 along the lengths of the electrically conductive material 104, variations in dielectric properties may be reduced, causing a reduction in differences in propagation rate through the electrically conductive material 104 and causing greater consistency in frequency response of the electrically conductive material 104, such as within the first and second traces 106 and 108.

The voids 120 may be positioned such that the voids 120 underlie the electrically conductive material 104 and footprints of at least some of the voids 120, as viewed in a plane parallel to the first major surface 110 of the first dielectric material 102, may at least partially laterally overlap with at least a portion of the electrically conductive material 104. For example, the footprints of at least some of the voids 120 may at least partially laterally overlap with a first width $W_1$ of the first quantity 106 of the electrically conductive material 104. In addition, the footprints of at least some of the voids 120 may at least partially laterally overlap with a second width $W_2$ the second quantity 108 of the electrically conductive material 104. More specifically, the footprint of at least one of the voids 120 (up to each void 120 in a series of the voids 120) may at least partially laterally overlap with each of the first quantity 106 and the second quantity 108 of the electrically conductive material 104. As a specific, nonlimiting example, the footprint of at least one of the voids 120 (up to each void 120 in the series of the voids 120) may extend laterally beyond each of the first quantity 106 and the second quantity 108 of the electrically conductive material 104.

In embodiments where the substrate 100 includes the second quantity 118 of the second dielectric material 112, the second quantity 118 of the second dielectric material may include a second series of voids 122 defined by second quantity 118 of the second dielectric material 112 extending from the first dielectric material 102 and the electrically conductive material 104 at least partially through (e.g., partially or entirely through) the second quantity 118 of the second dielectric material 112. The voids 122 may be positioned such that the voids 122 overlie the electrically conductive material 104 and second footprints of at least some of the voids 122 of the second series of voids 122 at least partially laterally overlap with the electrically conductive material 104. The overlap may exhibit any of the variations disclosed previously in connection with the first series of voids 120. In some embodiments, the first series of voids 120 and the second series of voids 122 may be of the same pattern, such that the voids 120 in the first quantity 116 of the second dielectric material 112 may be the same size, shape, depth, and lateral position as the voids 122 in the second quantity 118 of the second dielectric material 112. In other embodiments, the first series of voids 120 may have at least one of a different size, shape, depth, and lateral position of geometric centers of the voids 120 than the second series of voids 122.

The first and second series of voids 120 and 122 may be formed by removing portions of the second dielectric material 112 from one or more strata, plies, or layers that may be subsequently combined to form the first and second quantities (e.g., sheets) of the second dielectric material 112, forming holes defined by the second dielectric material 112. For example, the first and second series of voids 120 and 122 may be formed by mechanically drilling (e.g., milling), laser drilling, water cutting, without limitation, the locations in one or more of the strata, plies or layers (e.g., at least the directly adjacent stratum, ply, or layer and up to each stratum, ply, or layer) that may be subsequently combined to form the sheets that make up the quantities 116 and 118 of the second dielectric material 112. Sheets of the second dielectric material 112 (e.g., layered sheets of individual strata, plies, or layers) may be placed adjacent to the second major surface 114 on the second side, and optionally to the first major surface 110 and remaining regions 106 and 108 (and any others) of the electrically conductive material 104 on the first side, with the voids 120 and 122 at least partially aligned over and under the remaining regions 106 and 108 (and any others) of the electrically conductive material 104. As a specific, nonlimiting example, the voids 120 and 122 may be formed in locations of various strata, plies, or layers of the first dielectric material 102, which may be configured as a dielectric core, having their own traces (e.g., traces 106 and 108) supported thereon that will be positioned adjacent to certain traces (e.g., traces 106 and 108 configured to conduct signals and/or voltages, particularly high-speed, high-frequency, or high-speed and high-frequency signals) supported by overlying or undergirding strata, plies, or layers of other first dielectric materials 102, serving as respective dielectric cores, and/or second dielectric materials 112, and the stacked quantities of the first dielectric material 102, quantities of the second dielectric material 112, and voids 120 and 122 therein may form continuous layered voids 120 and 122 or voids interrupted by intermediate strata, plies, or layers of dielectric cores 102. The sheets of other quantifies of first dielectric material 102 and/or second dielectric material 112 may be secured to the first dielectric material 102 of the dielectric core to form the first and second quantities 116 and 118 of the second dielectric material 112 in response to application of pressure (and optionally exposure to heat).

The substrate 100 may optionally include a first ground plane 124 located on a side of the first quantity 116 of the second dielectric material 112 opposite the first dielectric material 102, the first quantity 116 of the second dielectric material 112 being interposed between the first ground plane 124 and the first dielectric material 102. In embodiments where the substrate 100 includes the second quantity 118 of the second dielectric material 112, a second ground plane 126 may be located on a side of the second quantity 118 of the second dielectric material 112 opposite the first dielectric material 102 and the electrically conductive material 104, the second quantity 118 of the second dielectric material 112 being interposed between the second ground plane 126 and the first dielectric material 102 and portions of the electrically conductive material 104. The first and second ground planes 124 and 126 may include masses of electrically conductive material. For example, the first and second ground planes 124 and 126 may be provided as unetched dielectric cores having sheets of electrically conductive material thereon. The first and second ground planes 124 and 126 may be secured to the first and second quantities 116 and 118 of the second dielectric material 112 by, for example, placing the first and second ground planes 124 and 126 proximate to the first and second quantities 116 and 118 of the second dielectric material 112, respectively, and applying pressure (and optionally exposing the assembly to heat).

In embodiments where the substrate 100 includes one or more quantities of electrically conductive material 104 interposed between ground planes 124 and 126 with one or more quantities 116 and 118 of one or more dielectric materials 102 and 112 therebetween, such as that shown in FIG. 1, the electrically conductive material 104 may be said to be configured as a strip line. The benefits of providing voids (e.g., holes) in dielectric materials 112 located proximate to electrically conductive materials 104 for routing signals may also be realized in other configurations for waveguides and substrates (e.g., microstrip lines, coplanar waveguides, conductor-backed coplanar waveguides, without limitation).

Figure 2:
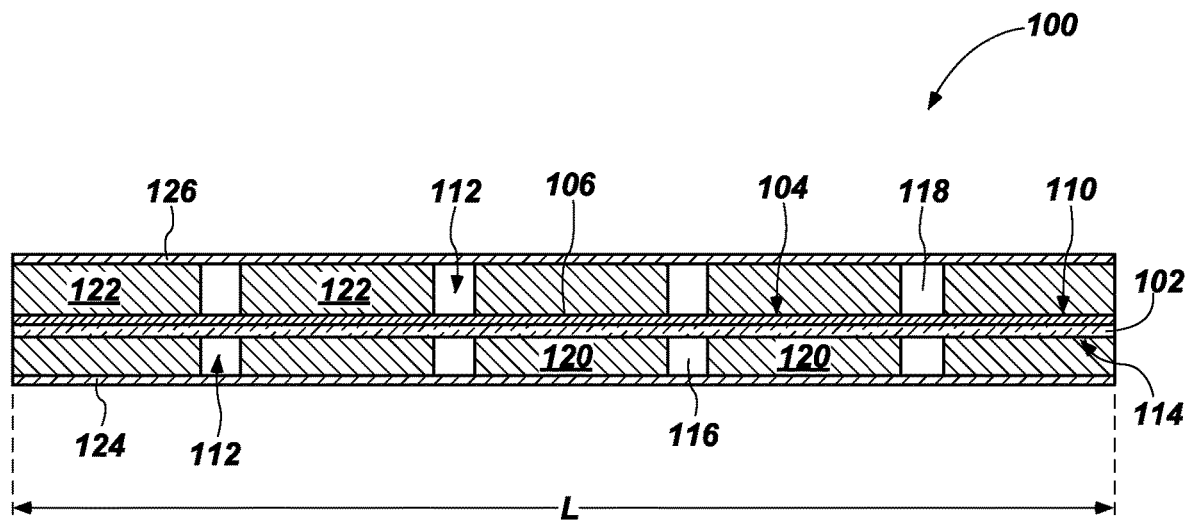
FIG. 2 is a rotated cross-sectional side view of the substrate of FIG. 1.

FIG. 2 is a rotated cross-sectional side view of the substrate 100 of FIG. 1. Specifically, FIG. 2 has been rotated 90° about a central axis of one of the voids 120 or 122, such that the traces 106 and 108 extend left-and-right in the view of FIG. 2, the traces 106 and 108 having been oriented to extend into and out of the page in FIG. 1. The first and second series of voids 120 and 122 may be located along portions of the length L of the electrically conductive material 104. The length L of the electrically conductive material 104 may extend in a direction parallel to the first major surface 110 of the first dielectric material 102, and may be identified as being significantly longer than the first and second widths $W_1$ and $W_2$ (see FIG. 1) of the first and second quantities 106 and 108 of the electrically conductive material 104. The first and second series of voids 120 and 122 may extends along, for example, at least a majority of the length L of the electrically conductive material 104. More specifically, the first and second series of voids 120 and 122 may be provided in a repeating pattern along, for example, an entire length L of the first and second quantities 106 and 108 of electrically conductive material 104.

Figure 3:
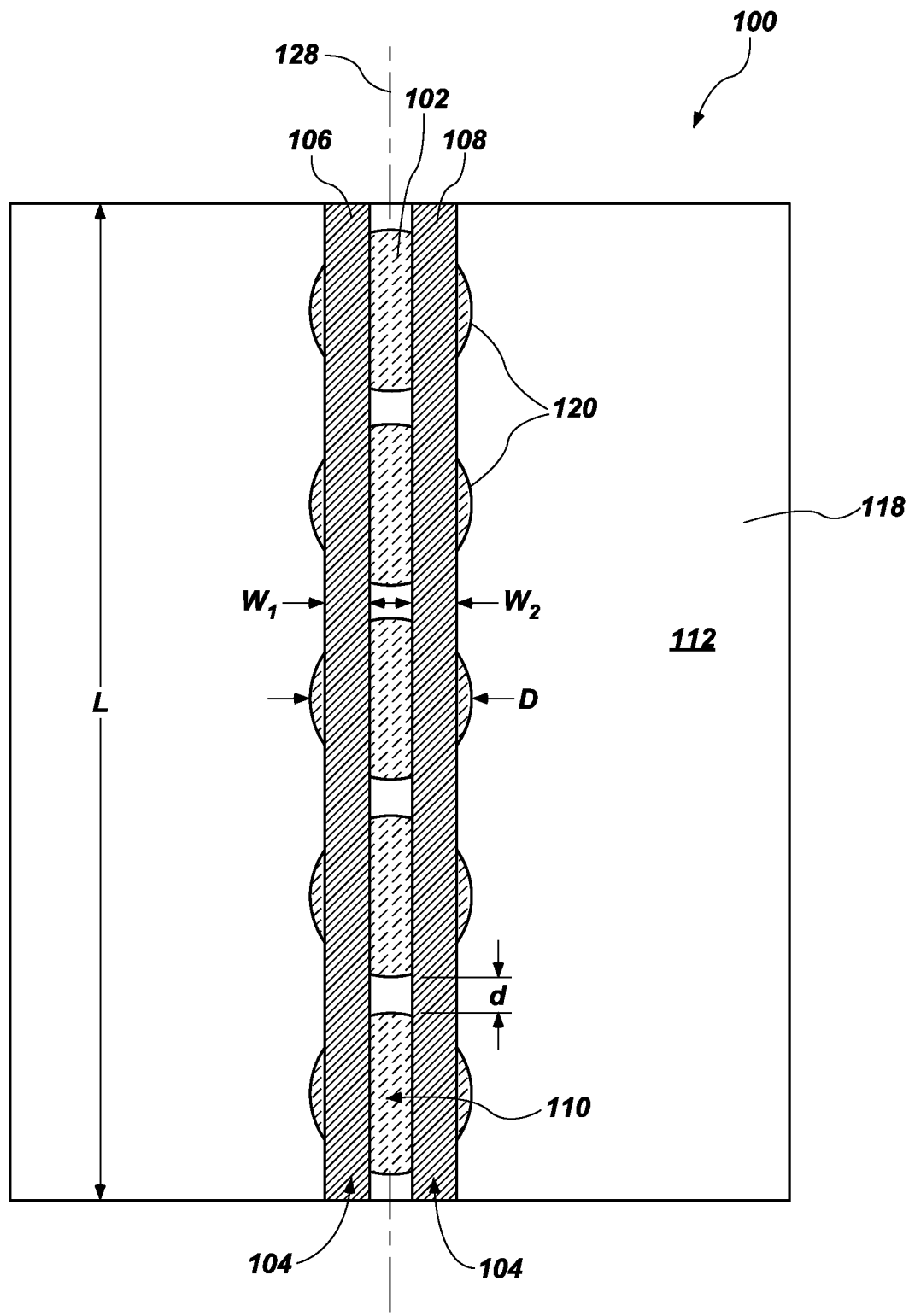
FIG. 3 is a top surface view of the substrate of FIG. 1.

FIG. 3 is a top surface view of the substrate 100 of FIG. 1. FIG. 3 omits the second ground plane 126, and depicts the second quantity 118 of the second dielectric material 112 as being transparent for the sake of clarity in depicting underlying features, such as the first and second quantities 116 and 118 of the electrically conductive material 104. A greatest lateral dimension D of the voids 120 and 122 may be greater than a greatest width $W_1$ and $W_2$ of the electrically conductive material 104. For example, in embodiments where the voids 120 and 122 are circular, the greatest lateral dimension D of the voids 120 and 122 may be their greatest diameter, and the greatest diameter may be greater than the first width $W_1$ of the first trace 106 alone, the second width $W_2$ of the second trace 108 alone, or the combination of the first width $W_1$ and the second width $W_2$ together. The voids 120 and 122 may generally form a line and may be aligned with the first and second quantities 106 and 108 of electrically conductive material 104 in such a way that a line 128 extending through geometric centers of the voids 120 and 122 in a direction parallel to the first major surface 110 of the first dielectric material 102 of the dielectric core may be parallel to a geometric center between the first and second quantities 106 and 108 of electrically conductive material extending in the same direction.

The voids 120 and 122 may be of any length extending along the lengths of the quantities 116 and 118 of the electrically conductive material 104, so long as the second dielectric material 112 retains sufficient mechanical strength and rigidity for its intended application. A shortest distance d between laterally adjacent voids 120 and 122 may be less than or equal to the greatest lateral dimension D of any one of the voids 120 and 122. For example, the shortest distance d between laterally adjacent voids 120 and 122 may be between about one-tenth and about nine-tenths of the greatest lateral dimension D of any one of the voids 120 and 122. More specifically, the shortest distance d between laterally adjacent voids 120 and 122 may be between about one-fifth and about three-fourths-thirds of the greatest lateral dimension D of any one of the voids 120 and 122. As a specific, nonlimiting example, the shortest distance d between laterally adjacent voids 120 and 122 may be between about one-fourth and about one-half (e.g., about one-third) of the greatest lateral dimension D of any one of the voids 120 and 122. Leaving portions of the second dielectric material 112 between adjacent voids 120 and 122 proximate to (e.g., over, below, or over and below) the electrically conductive material 104 may better structurally reinforce the substrate 100.

Figure 4:
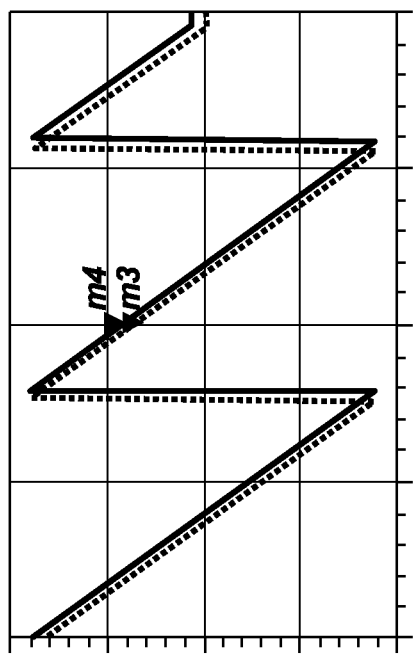
FIG. 4 is a pair of graphs demonstrating that the configurations for substrates disclosed in connection with FIGS. 1 through 3 produce a reduction in disparities in signal propagation rates compared to conventional substrates.
Figure 4:
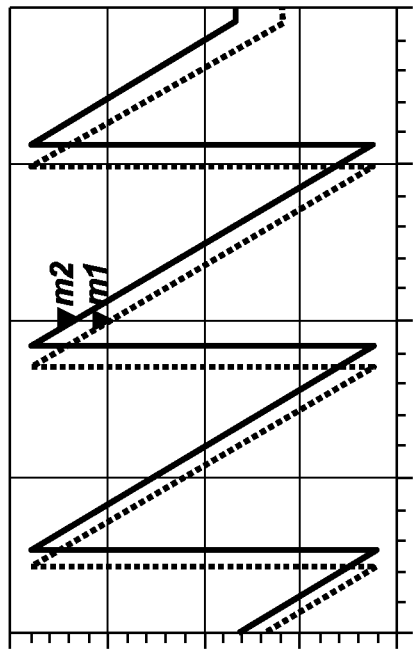

FIG. 4 is a pair of graphs demonstrating that the configurations for substrates in accordance with this disclosure produce a reduction in disparities in signal propagation rates compared to conventional substrates. In particular, FIG. 4 demonstrates that configurations for substrates in accordance with this disclosure reduce the extent to which the fiber weave effect may affect the synchronization of signals traveling through substrates including fiber-matrix composite materials locate proximate to the electrically conductive materials carrying those signals. A first graph 130 shows the phase synchronization of two signals, respectively denoted m1 and m2, transmitted through traces of a conventional substrate including fiber-matrix materials and lacking voids versus the frequency of those signals, with the frequency presented on the x axis and the phase presented on the y axis. In accordance with the first graph 130, all transmitted signals are at least somewhat out of phase, and phase mismatch increases as signal frequency increases. By contrast, the second graph 132 shows greater phase synchronization across all frequencies for two signals denoted m3 and m4, with the phase mismatch at high frequencies being less than the phase mismatch even at low frequencies in the first graph 130, reflecting the reduction in the fiber weave effect achieved by introducing voids 120 and 122 in the substrates proximate to the traces, and particularly in fiber-matrix materials, in accordance with this disclosure.

The percent decrease in the propagation rate of signals through electrically conductive materials proximate to voids in dielectric materials (e.g., dielectric, fiber-matrix composite materials) may depend primarily on the greatest lateral dimension of the voids (e.g., the diameter in the case of cylindrical voids) and the shortest distance between adjacent voids. For example, the percent decrease in propagation rate of signals through electrically conductive materials proximate to voids in dielectric materials may be calculated according to the following formula: %=100×(D/(D+S)); where % is the percent decrease in propagation rate, D is the greatest lateral dimension of the voids, and S is the shortest distance between the voids.

Figure 5:
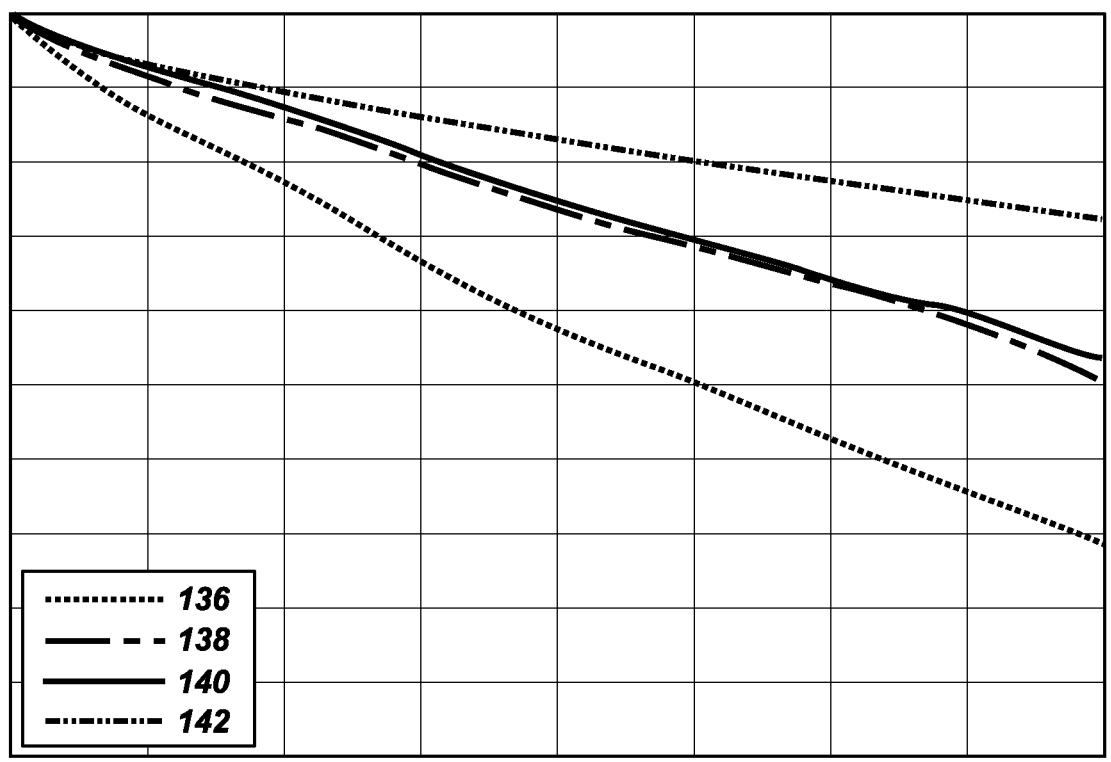
FIG. 5 is a graph demonstrating that the configurations for substrates disclosed in connection with FIGS. 1 through 3 produce substantially consistent frequency response.

FIG. 5 is a graph 134 demonstrating that the configurations for substrates disclosed in connection with FIGS. 1 through 3 produce substantially consistent frequency response. The graph 134 depicts the intensity of signals as measured in decibels per inch on the y axis against the frequency of the signals on the x axis, and the different plotted lines use different materials and configurations for the substrate. The lowest dashed line 136 represents a conventional substrate lacking voids employing lower-cost dielectric materials (e.g., MEGTRON® 4), and shows significant decrease in signal intensity with increasing signal frequency. By contrast, the next-lowest dashed line 138 represents a conventional substrate lacking voids employing higher-cost dielectric materials (e.g., MEGTRON® 6), and shows less decrease in signal intensity with increasing signal frequency. The solid line 140 represents a substrate in accordance with this disclosure (i.e., having voids) but employing the same lower-cost dielectric materials (e.g., MEGTRON® 4), and shows similar, though in most cases still improved, decrease in signal intensity with increasing signal frequency when compared to the conventional higher-cost substrate of line 138, and significant improvement relative to the other lower-cost substrate of line 136. Finally, dashed line 142 represents the response of standalone electrically conductive materials, having the smallest decrease in signal intensity by virtue of the absence of interaction with any dielectric materials.

$$\% = \frac{(L/D + S) \times (\pi \times (D/2)^2)}{L \times D} \times 100$$

The percent decrease in loss of signal intensity may depend primarily on the length of the transmission lines, the greatest lateral dimension of the voids (e.g., the diameter in the case of cylindrical voids), and the shortest distance between the voids. For example, the percent decrease in loss of signal intensity may be calculated according to the following formula:

$$\% = \frac{(L/D + S) \times (\pi \times (D/2)^2)}{L \times D} \times 100;$$

where % is the percent decrease in loss of signal intensity, L is the length of a trace, D is the greatest lateral dimension of the voids, and S is the shortest distance between the voids.

Figure 6:
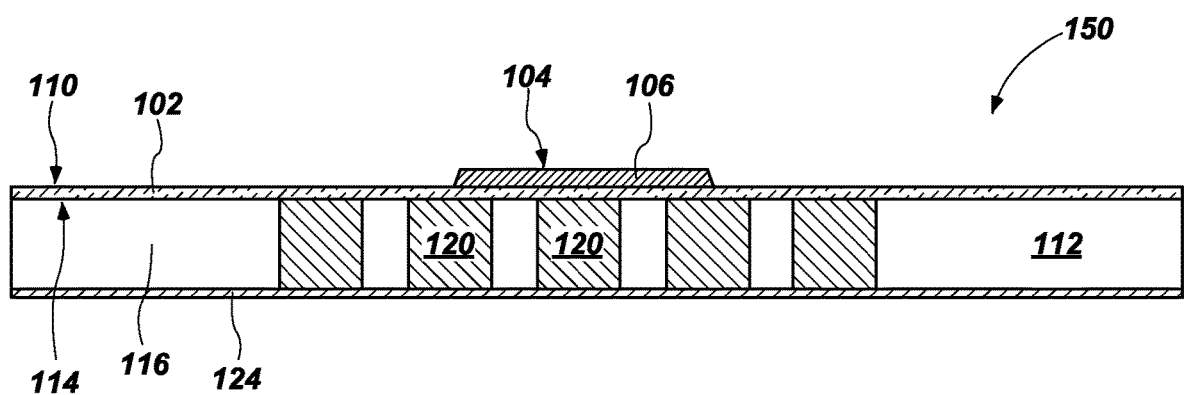
FIG. 6 is a cross-sectional side view of another embodiment of a substrate configured to route electrical signals.

FIG. 6 is a cross-sectional side view of another embodiment of a substrate 150 (e.g., a printed circuit board, a subcomponent of a printed circuit board, portion of a printed circuit board, an intermediate product in a method of forming a printed circuit board) configured to route electrical signals. In some embodiments, the substrate 150 may lack the second quantity 118 of the second dielectric material 112 (see FIG. 1), such that the electrically conductive material 104 and portions of the first major surface 110 of the first dielectric material 102 of the dielectric core may be exposed at an exterior of the substrate 150. In some embodiments, the substrate 150 or relevant portions thereof may lack the second quantity 108 of the electrically conductive material 104, such that the first quantity 106 of the electrically conductive material 104 may be a standalone transmission line for certain signals transmitted utilizing the substrate 150. In such embodiments, the substrate 150 may be said to be configured as a microstrip line.

Figure 7:
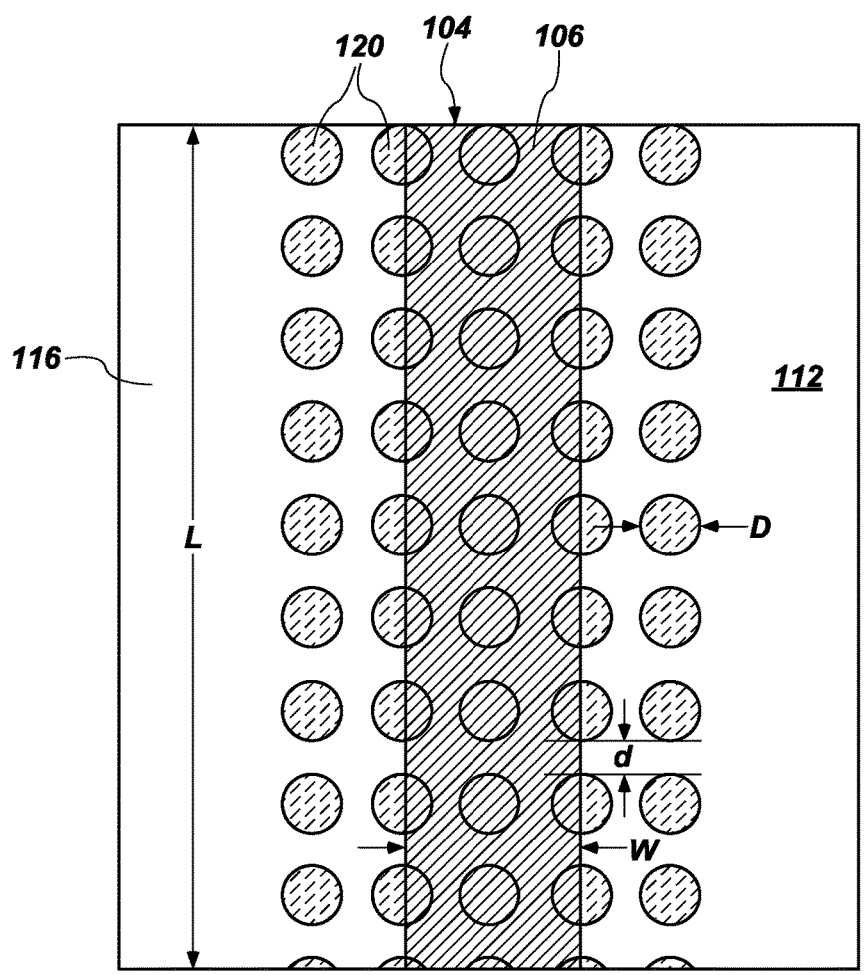
FIG. 7 is a top surface view of the substrate of FIG. 6.

FIG. 7 is a top surface view of the substrate 150 of FIG. 6. In FIG. 7, the first dielectric material 102 and the sole quantity 106 of the electrically conductive material 104 may be depicted as being partially transparent so as to provide greater clarity in depicting the underlying quantity 116 of the second dielectric material 112 and associated voids 120, and first ground plane 124, seen in FIG. 6 opposing opposite major surface 114 is not shown in FIG. 7. In some embodiments the greatest lateral dimension D of the voids 120 may be less than a greatest width W of the electrically conductive material 104. For example, the voids 120 may generally form a grid and may repeat in a pattern laterally to provide the voids 120 across at least a portion of the width W of the trace 106 of electrically conductive material 104, as well as repeat in a pattern longitudinally to extend along the length L of the electrically conductive material 104. More specifically, a combination of the greatest lateral dimension D of the voids 120 with the laterally adjacent shortest distances d between the voids 120 may be less than the width W of the trace 106, such that at least portions of the footprints of at least two of the voids 120 in a laterally extending row of the grid may overlap laterally with the trace 106. As a specific, nonlimiting example, the grid of voids 120 may include any number of voids 120 in a laterally extending row (e.g., 3, 4, 5, 6, 7), with two or more of the voids 120 at least partially laterally overlapping with the trace 106 (e.g., two voids 120 at least partially laterally overlapping with the dielectric material 112 laterally centered over the trace 106, three voids 120 at least partially laterally overlapping with the trace 106 with the central void 120 laterally centered over the trace 106), and columns of the voids 120 extending along the length L of the trace 106.

A cross-sectional shape of voids 120 (and/or 122 (see FIG. 1)), as viewed in a plane parallel to the first major surface 110 of the first dielectric material 102, may be, for example, a circle, oval, ellipse, rectangle, or polygon. In some embodiments, each void 120 may have the same cross-sectional shape. In other embodiments, different voids 120 may have different cross-sectional shapes.

Figure 8:
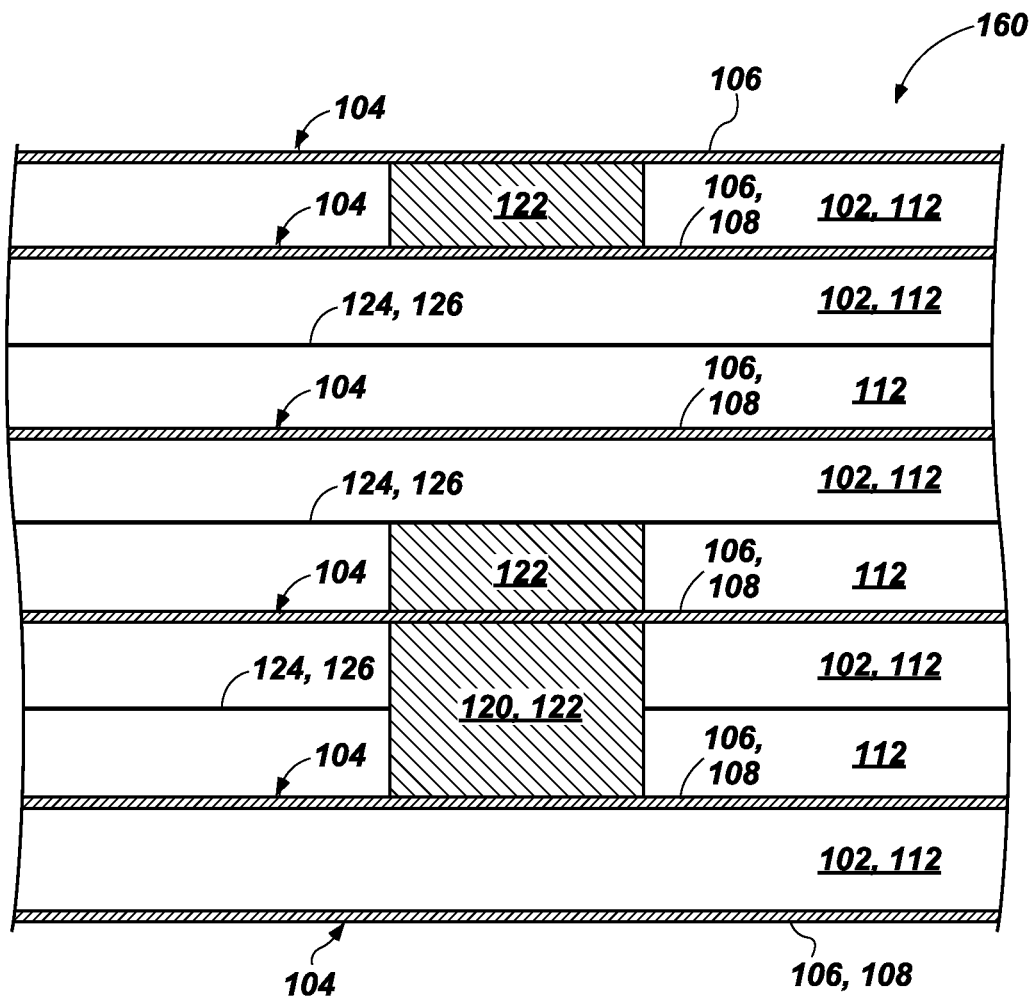
FIG. 8 is a cross-sectional side view of another embodiment of a substrate configured to route electrical signals.

FIG. 8 is a cross-sectional side view of another embodiment of a substrate 160 (e.g., a printed circuit board, a subcomponent of a printed circuit board, portion of a printed circuit board, an intermediate product in a method of forming a printed circuit board) configured to route electrical signals. The voids 120 and 122 may be located or omitted throughout the substrate 160 as appropriate to better match cost of production and operating capacity to operational demands. For example, the voids 120 and 122 may extend through some quantities of dielectric material 102 and 112, and may be omitted in other quantities of dielectric material 102 and 112 (e.g., those quantities of dielectric material 102 and 112 may be left intact), adjacent to one or more quantities of electrically conductive material 104. More specifically, the voids 120 and 122 may be positioned, for example, in certain strata, plies, or layers of fiber-matrix dielectric material 102 and 112, which may extend longitudinally between the ground planes 124 and 126 and/or traces 106 and 108 of electrically conductive material 104, and be omitted from other strata, plies, or layers of the fiber-matrix dielectric material 102 and 112.

As a specific, nonlimiting example, voids 120 and/or 122 may be located in those strata, plies, or layers of dielectric material 102 and 112 located proximate to the exterior of the substrate 160, as shown at the top of the substrate 160 shown in FIG. 8, or may be omitted from those strata, plies, or layers of dielectric material 102 and 112 located proximate to the exterior of the substrate 160, as shown at the bottom of the substrate 160 of FIG. 8. As another specific, nonlimiting example, voids 120 and/or 122 may be located in one stratum, ply, or layer of dielectric material 102 and 112 and may be omitted from the immediately adjacent stratum, ply, or layer of dielectric material 102 and 112, as shown in the center two strata, plies, or layers of the substrate 160 of FIG. 8. As still another specific, nonlimiting example, voids 120 and/or 122 may be located in one stratum, ply, or layer of dielectric material 102 and 112 and may be also be located in the immediately adjacent stratum, ply, or layer of dielectric material 102 and 112, as shown in the two strata, plies, or layers of the substrate 160 of FIG. 8 underlying the central two strata, plies of or layers. Such a layered structure may be formed, for example, by forming the voids 120 and/or 122 in appropriate locations on respective preformed strata, plies, or layers of the dielectric material 102 and/or 112 (with or without the associated ground planes 124 and 126 and/or traces 106 and 108 of electrically conductive material 104 thereon/therein), the strata, plies, or layers of the dielectric material 102 and/or 112 may be stacked (e.g., placed adjacent to one another or in between other strata, plies, or layers), and the strata, plies, or layers of the dielectric material 102 and/or 112 may be interconnected response to application of pressure (and optionally exposure to heat).

Figure 9:
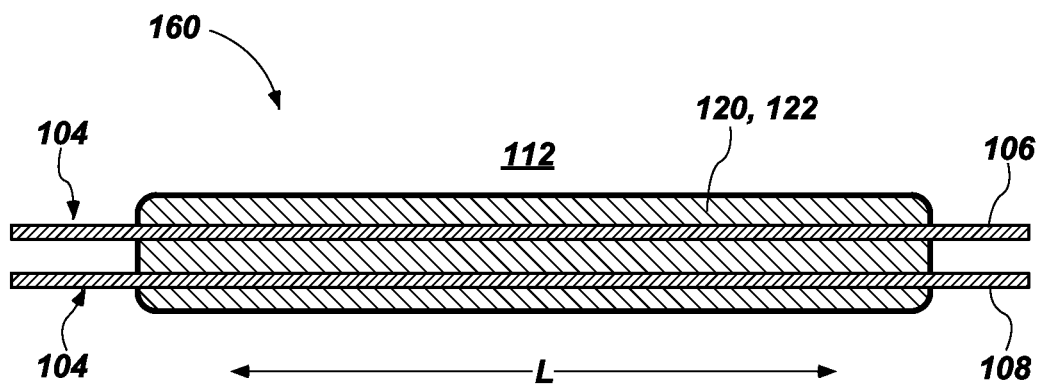
FIG. 9 is a top view of a portion of the substrate of FIG. 8.

FIG. 9 is a top view of a portion of the substrate 160 of FIG. 8. The depicted portion may correspond to a top exterior, or may be located within the interior of the substrate 160. In some embodiments, the voids 120 and 122 may extend laterally along the lengths L of the traces 106 and 108 of electrically conductive material 104. Each of voids 120 and 122 is illustrated as an elongated rounded rectangle. The extent to which the voids 120 and 122 may extend along the lengths L of the traces 106 and 108 may depend at least partially on the structural support and stiffness of the remaining portions of the substrate 160. For example, the size and length of the voids 120 and 122, as measured in a direction parallel to the length L of the traces 106 and 108 may be such that the substrate 160 retains sufficient stiffness to structurally support the traces 106 and 108 in accordance with the operational demands for the substrate 160. Where that length is insufficient to cover the entire length L of the traces 106 and 108, the voids 120 and 122 may still be elongated to a length which still provides the required structural stiffness, and may repeat over an appropriate length of the traces 106 and 108 to have the desired reduction in loss of signal fidelity and in the fiber weave effect.

Techniques for configuring substrates in accordance with this disclosure may enable substrates employing lower-cost materials to achieve performance conventionally only achievable using higher-cost materials. In addition, techniques for configuring substrates in accordance with this disclosure may enable the performance of different regions of substrates to be tailored to achieve different performance requirements. For example, in regions where high-speed, high-frequency, and/or high-fidelity signals are to be transmitted, voids in accordance with this disclosure may be provided in quantities of dielectric material proximate to the electrically conductive material for transmitting those signals, whereas regions where lower-speed, lower-frequency, and lower fidelity signals are tolerable may lack the voids. When compared to conventional approaches for handling high-speed, high-frequency, and/or high-fidelity signals, which generally involve forming the entire substrate from higher-cost materials, techniques in accordance with this disclosure may enable different regions to have different performance characteristics and may enable lower-cost materials to exhibit the performance of higher-cost materials.

Though various features for substrates and voids have been discussed in connection with the embodiments of this disclosure, those features may be combined with one another to produce other embodiments contemplated by the inventors. For example, the different shapes for voids disclosed in connection with FIGS. 7 and 9 may be used instead of, or in combination with, the uniform shapes for voids disclosed in connection with FIG. 3, and the uniform shapes for voids disclosed in connection with FIG. 3 may be used instead of the different shapes for voids disclosed in connection with FIGS. 7 and 9. As another example, the grid for voids disclosed in connection with FIG. 7 may be used instead of the line of voids disclosed in connection with FIG. 3 or the elongated voids disclosed in connection with FIG. 9, the line of voids disclosed in connection with FIG. 3 may be used instead of the grid of voids disclosed in connection with FIG. 7 or the elongated voids disclosed in connection with FIG. 9, or the elongated voids disclosed in connection with FIG. 9 may be used instead of the line of voids disclosed in connection with FIG. 3 or the grid of voids disclosed in connection with FIG. 7.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A substrate configured to route electrical signals, comprising:
    a first dielectric material;
    an electrically conductive material located on a first side of the first dielectric material;
    a second dielectric material located on a second, opposite side of the first dielectric material;
    another quantity of the second dielectric material located on the first side of the first dielectric material partially over the electrically conductive material;
    a series of voids defined by the second dielectric material extending from the first dielectric material at least partially through the second dielectric material, footprints of at least some of the voids of the series of voids at least partially laterally overlapping with the electrically conductive material; and
    another series of voids defined by the other quantity of the second dielectric material and extending from the first dielectric material and the electrically conductive material at least partially through the other quantity of the second dielectric material, other footprints of at least some of the voids of the other series of voids at least partially laterally overlapping with the electrically conductive material;
    wherein each of the series of voids and the other series of voids remains free of occupying material within the series of voids and the other series of voids.

2. The substrate of claim 1, wherein the footprints of the at least some of the voids of the series of voids at least partially laterally overlaps with a width of the electrically conductive material.

3. The substrate of claim 1, wherein at least one of the voids of the series of voids extends entirely through the second dielectric material.

4. The substrate of claim 1, wherein a greatest lateral dimension of the voids of the series of voids is greater than a greatest width of the electrically conductive material.

5. The substrate of claim 1, wherein a greatest lateral dimension of the voids of the series of voids is less than a greatest width of the electrically conductive material.

6. The substrate of claim 1, wherein a shortest distance between adjacent voids of the series of voids is about one-third a greatest lateral dimension of the adjacent voids or less.

7. The substrate of claim 1, wherein a cross-sectional shape of at least one void of the series of voids is selected from the group consisting of: a circle, an oval, an ellipse, a rectangle, or a polygon.

8. The substrate of claim 1, further comprising another quantity of the electrically conductive material located laterally adjacent to the electrically conductive material on the first side of the first dielectric material.

9. The substrate of claim 8, wherein the footprints of at least some of the voids of the series of voids at least partially laterally overlap with the other quantity of the electrically conductive material.

10. The substrate of claim 9, wherein the footprint of at least one of the voids of the series of voids at least partially laterally overlaps with the electrically conductive material and the other quantity of the electrically conductive material.

11. The substrate of claim 10, wherein the footprint of the at least one of the voids of the series of voids extends laterally beyond each of the electrically conductive material and the other quantity of the electrically conductive material.

12. The substrate of claim 1, wherein the voids of the series of voids are aligned with corresponding voids of the other series of voids.

13. The substrate of claim 1, further comprising a ground plane located on a side of the other quantity of the second dielectric material opposite the first dielectric material and the electrically conductive material.

14. The substrate of claim 1, wherein the electrically conductive material is configured as a strip line.

15. The substrate of claim 1, wherein a first thickness of the second dielectric material is different from a second thickness of the other quantity of the second dielectric material.

16. The substrate of claim 1, further comprising a ground plane located on a side of the second dielectric material opposite the first dielectric material.

17. The substrate of claim 1, wherein the electrically conductive material is configured as a microstrip line.

18. A printed circuit board, comprising:
    a dielectric core;
    a trace including electrically conductive material supported on a first major surface of the dielectric core;
    a dielectric material located on a second, opposite major surface of the dielectric core;
    another quantity of the dielectric material located on the first major surface of the dielectric core partially over the trace;
    a pattern of holes extending from the dielectric core at least partially through the dielectric material, footprints of at least some of the holes of the pattern of holes at least partially laterally overlapping with a width of the trace, the pattern of holes extending along at least a majority of a length of the trace; and
    another pattern of holes defined by the other quantity of the dielectric material and extending from the dielectric material and the electrically conductive material at least partially through the other quantity of the dielectric material, other footprints of at least some of the holes of the other patterns of holes at least partially laterally overlapping with the trace;
    wherein each of the pattern of holes and the other pattern of holes remains free of occupying material within the pattern of holes and the other pattern of holes.

19. The printed circuit board of claim 18, wherein the dielectric material comprises a fiber-matrix composite material.

20. A method of making a substrate, comprising:
    removing portions of electrically conductive material located on a first major surface of a dielectric core, leaving a trace of the electrically conductive material on the first major surface;

forming a series of voids extending at least partially through a dielectric material by removing portions of the dielectric material to leave the voids;

placing the dielectric material adjacent to a second major surface of the dielectric core located on a side of the dielectric core opposite the trace, footprints of at least some of the voids of the series of voids at least partially laterally overlapping with the trace;

forming another series of voids extending at least partially through another quantity of the dielectric material by removing portions of the other quantity of the dielectric material to leave the other series of voids;

placing the other quantity of the dielectric material adjacent to the first major surface of the dielectric core located on a same side of the dielectric core as the trace, footprints of at least some of the voids of the other series of voids at least partially laterally overlapping with the trace;

securing the dielectric material and the other quantity of the dielectric material to the dielectric core; and leaving each of the series of voids and the other series of voids free of occupying material within the series of voids and the other series of voids.

21. The method of claim 20, wherein forming the series of voids comprises drilling the series of voids entirely through the dielectric material.

22. The method of claim 20, wherein placing the dielectric material adjacent to the second major surface of the dielectric core comprises placing a stratum comprising the dielectric material adjacent to the second major surface of the dielectric core.

23. The method of claim 22, wherein placing the other quantity of the dielectric material adjacent to the first major surface of the dielectric core comprises placing another stratum comprising the other quantity of the dielectric material on a side of the dielectric core opposite the stratum.

24. An intermediate product in a method of making a substrate configured to route electrical signals, comprising:
- a first stratum, the first stratum comprising:
  - a first dielectric material;
  - an electrically conductive material located on a first side of the first dielectric material;
  - a second dielectric material located on a second, opposite side of the first dielectric material; and
  - a series of voids defined by the second dielectric material extending from the first dielectric material at least partially through the second dielectric material, footprints of at least some of the voids of the series of voids at least partially laterally overlapping with the electrically conductive material; and
- a second stratum adjacent to the first stratum, the second stratum comprising:
  - another quantity of the second dielectric material located on the first side of the first dielectric material partially over the electrically conductive material; and
  - another series of voids defined by the other quantity of the second dielectric material and extending from the first dielectric material and the electrically conductive material at least partially through the other quantity of the second dielectric material, other footprints of at least some of the voids of the other series of voids at least partially laterally overlapping with the electrically conductive material;
- wherein each of the series of voids and the other series of voids remains free of occupying material within the series of voids and the other series of voids.

* * * * *